United States Patent [19]

Wieder et al.

[11] Patent Number: 4,823,180
[45] Date of Patent: Apr. 18, 1989

[54] PHOTO-TRANSISTOR IN MOS THIN-FILM TECHNOLOGY AND METHOD FOR PRODUCTION AND OPERATION THEREOF

[75] Inventors: Armin Wieder, Gauting; Lothar Risch, Ottobrunn, both of Fed. Rep. of Germany

[73] Assignee: Siemens Aktiengesellschaft, Berlin and Munich, Fed. Rep. of Germany

[21] Appl. No.: 437,302

[22] Filed: Oct. 28, 1982

[30] Foreign Application Priority Data

Nov. 26, 1981 [DE] Fed. Rep. of Germany ....... 3146981

[51] Int. Cl.[4] ...................... H01L 27/14; H01L 31/10
[52] U.S. Cl. ...................... 357/30; 357/23.7; 357/4; 357/59; 250/211 J
[58] Field of Search ............... 357/23 TF, 4, 59, 30; 250/211 J

[56] References Cited

U.S. PATENT DOCUMENTS

| 3,348,074 | 10/1967 | Diemer | 357/23.7 |
|---|---|---|---|
| 3,514,676 | 5/1970 | Fa | 357/59 |
| 3,704,376 | 11/1972 | Lehovec et al. | 250/211 J |
| 3,840,888 | 10/1974 | Gaensslen et al. | 357/23 TF |
| 4,143,266 | 3/1979 | Borel et al. | 357/4 |
| 4,272,880 | 6/1981 | Pashley | 357/23 TF |
| 4,362,766 | 12/1982 | Dannhauser et al. | 357/59 |
| 4,365,264 | 12/1982 | Mukai et al. | 357/59 |
| 4,396,930 | 8/1983 | Mizutani | 357/59 |

FOREIGN PATENT DOCUMENTS 0023021  1/1981  European Pat. Off. ............... 257/4

OTHER PUBLICATIONS

"Floating Gate . . . Device", RCA Tech. Notes, 1152, May 24, 1976, Medwin et al., p. 2.
G. Hass and R. E. Thun, Physics of Thin-Films, vol. 2, Acedemic Press 1964; P. K. Weimer, "The Insulated Gate Thin Film Transistor", pp. 147–192 at 187.

Primary Examiner—Andrew J. James
Assistant Examiner—Jerome Jackson
Attorney, Agent, or Firm—Hill, Van Santen, Steadman & Simpson

[57] ABSTRACT

A photo-transistor in MOS thin-film technology operable with alternating voltages is comprised of a semiconductor body (3) composed of polycrystalline silicon having source (4) and drain (5) zones therein spaced apart by an undoped channel region (13) and having a gate electrode (1, 10) separated from the semiconductor body (3) by a SiO$_2$ layer (2) produced by thermal oxidation. These phototransistors are easily and reproducably produced and are characterized by low threshold voltages and a good transistor characteristic curve. Thus, these photo-transistors are well suited for use as sensor elements, opto-couplers, time-delay elements and as photo-transistors in VLSI circuits.

8 Claims, 1 Drawing Sheet

PHOTO-TRANSISTOR IN MOS THIN-FILM TECHNOLOGY AND METHOD FOR PRODUCTION AND OPERATION THEREOF

BACKGROUND OF THE INVENTION

1. Field of the Invention

The invention relates to a photo-transistor in MOS thin-film technology, and somewhat more particularly to such photo-transistors, method of producing the same and a method of operating the same.

2. Prior Art

Photo-transistors are primarily bi-polar transistors with which the emitter-collector current is increased by photo-injection of minority carriers into the base. A present substantial disadvantage of such photo-transistors is an upper frequency limit at a few kilohertz.

A photo-transistor in MOS thin-film technology is described in G. Hass and R. E. Thun, *Physics of Thin Films*, Vol. 2, Academic Press (1964), in an article by P. K. Weimer, "The Insulated Gate Thin-Film Transistor", pages 147–192, at 187. The light-sensitive transistors described there consist of photo-conductive cadmium sulfide (CdS) and contains an insulation layer composed of silicon mono-oxide or calcium fluoride, which is additionally vapor-deposited onto the CdS layer. Deep and shallow volume traps below the conduction band are additionally filled by carriers produced by light (photons) and are then emptied by field ionization. As a result, the drain current increases due to a photo-current. This transistor is already conductive in the dark and exhibits poor transistor properties (distorted characteristics). Since the semiconductor body of this transistor is composed of a compound and the insulation layer must be additionally applied thereto, the manufacture thereof is difficult to reproduce.

SUMMARY OF THE INVENTION

The invention provides a photo-transistor which is not only easy to produce and which can be positioned in a space-saving manner in a second semiconductor plane but which also has the property of changing its conductivity only with exposure to light as a function of light intensity and operating frequency. Moreover, photo-transistors constructed in accordance of the principles of the invention are useful at relatively high frequencies ($f_g >> 10$ kHz) and at low operating voltages of about 5 to 10 volts.

In accordance with the principles of the invention, photo-transistors in MOS thin-film technology are provided which have the following characteristics:

(a) a semiconductor body composed of polycrystalline silicon having a source zone and drain zone located therein and spaced from one another by an undoped channel region; and (b) a gate electrode positioned on the semiconductor body and composed of polycrystalline silicon, separated from the semiconductor body by a SiO$_2$ layer generated on the semiconductor body by thermal oxidation.

The functioning principles of photo-transistors of the invention may be explained as follows:

Because of the positioning and properties of the respective layers, the boundary surface between the polycrystalline silicon and the oxide generated by thermal oxidation has a high defect density in the proximity of the conduction band. Added thereto are defects in the volume of the polycrystalline silicon or, respectively, in the grain boundaries. The effect of these defects is that no electrical current flows from the source toward the drain in the unexposed condition (absence of light) of the photo-transistor upon application of an alternating voltage (about 1 kHz) to the gate.

Without exposure, the surface potential can only follow the gate voltage very slowly. Many boundary defects or grain boundaries must be reversed. The effect this has on the transistor properties is that of a high threshold voltage and low mobility. Upon exposure, the boundary surface and volume defects are partially filled and with increasing illumination intensity, more and more defects are further occupied, or grain boundary potential barriers are lowered and the surface potential and, thus, the drain current follows the gate voltage faster and faster. In terms of transistor properties, this means that the threshold voltage decreases and simultaneously the mobility of the electrons increases. An electrical current can now flow from the source toward the drain as a function of the gate voltage. The conductance of the photo-transistors thus increases with increased light intensity. With high light intensities, frequencies greater than 10 kHz can be achieved. Thus, a new photo-transistor effect is achieved by practicing the principles of the invention.

In certain embodiments of the invention, the polycrystalline silicon semiconductor body is generated by precipitation from a suitable vapor phase (ie. a silicon-containing gas) onto a low-resistant, mono-crystalline silicon substrate functioning as a gate electrode and provided with a SiO$_2$ layer by thermal oxidation or generated by precipitation from a suitable vapor phase onto an insulating substrate. The source and drain zones in this polycrystalline silicon semiconductor body are doped with a concentration of more than about $10^{18}$ arsenic ions per cubic centimeter by masked diffusion or ion implantation.

In certain embodiments of the invention, in order to reduce the density of the fast surface states, a passivation layer comprised of a material containing silicon is provided onto a photo-transistor of the invention after its manufacture. Annealing with this type of passivation layer causes the free valences at the Si/SiO$_2$ boundary surface to become saturated with hydrogen. Silicon nitride or amorphous silicon which is produced by an electrical low pressure glow discharge, are suitable as passivation materials.

DESCRIPTION OF THE PREFERRED EMBODIMENTS

Figure 1:
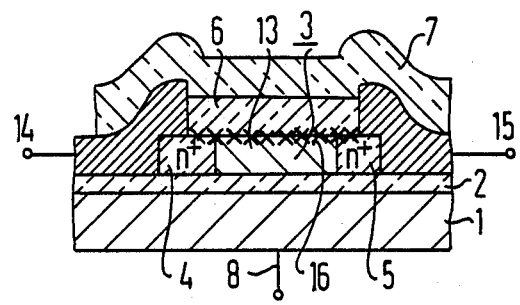
FIGS. 1 and 2 are elevated, partial, sectional views of two special embodiments of photo-transistors of the invention.

In order to produce an inventive photo-transistor as shown in FIG. 1, an SiO$_2$ layer 2 in a thickness of about 30 to 50 nm is generated by means of thermal oxidation onto a mono-crystalline, low-resistant (about 0.1 ohm/cm) silicon substrate 1. An undoped polycrystalline silicon layer 3, which is about 500–1000 nm thick, is deposited on the SiO$_2$ layer 2 by thermal decomposition of silane (SiH$_4$) at a temperature of about 625° C. Between these two layers 2 and 3 the high defect density 16 in the proximity of the conduction band enabling the photosensitivity is generated. Subsequently, highly n+ doped regions 4 and 5, which respectively form the source (4) and the drain (5) zones, are produced in the polycrystalline silicon layer 3 by masked diffusion or ion implantation of arsenic ions in a concentration greater than about $10^{18}$ cm$^{-3}$, with an undoped channel 13 located therebetween. The source zone 4 and the drain zone 5 are preferably separated by more than about 3,000 nm. Particularly in the region of the undoped channel 13 of the polycrystalline layer 3, the arrangement is then provided with a protective oxide layer 6 composed of SiO$_2$ layer and having a layer thickness of about 100 to 200 nm, which is then covered with a passivation layer 7 composed of silicon nitride or amorphous silicon and which has a layer of thickness of at least about 500 nm. This occurs by a CVD reaction (ie. a chemical vapor deposition) in an electrical low pressure glow discharge and subsequent tempering. Subsequently, a source terminal 14 is applied adjoining the source zone 4 and a drain terminal 15 is applied adjoining the drain zone 5, as well as a gate terminal 8 is applied to the low resistance substrate 1.

Figure 2:
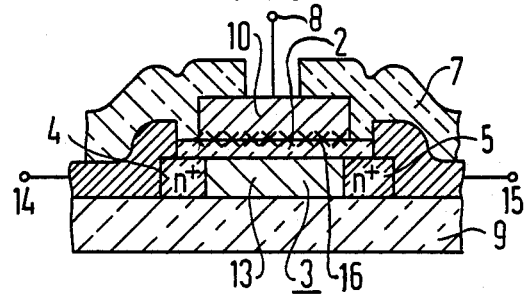

The photo-transistor structure illustrated at FIG. 2 is produced by providing a substrate 9 (composed, for example, of SiO$_2$) comprised of an amorphous material which, as in the case of the structure shown in FIG. 1, is provided with an undoped polycrystalline silicon layer 3 generated from a vapor phase. Then, as has already been described in conjunction with the structure of FIG. 1, the source and drain zones 4 and 5 are produced and the surface of the polycrystalline silicon body 3 is covered with a thermally grown oxide layer 2 (SiO$_2$ layer having a layer thickness of about 30 to 50 nm). After precipitation and structuring of the gate electrode 10, composed of polycrystalline silicon, a layer 7 serving for passivation and composed of silicon nitride or amorphous silicon, is precipitated to a layer thickness of at least 500 nm in a glow discharge plasma and the arrangement, as described earlier is provided with source/drain terminals 14 and 15 and gate terminals 8 after removal of the corresponding regions of the passivation layer 7. 16 is the photosensitive interface layer.

Figure 3A:
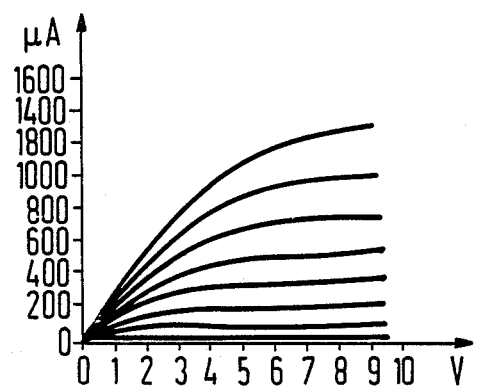
FIGS. 3a and 3b are graphical illustrations showing the transistor characteristics (100 through 1000 Hz) without exposure (FIG. 3b) and with exposure (FIG. 3a).
Figure 3B:
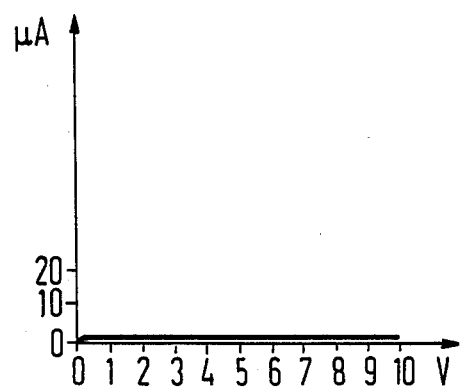

FIGS. 3a and 3b show the transistor characteristics without exposure (FIG. 3b) and with exposure (FIG. 3a) for a photo-transistor constructed in accordance of the principles of the invention and having a channel width W=100 μm and a channel length L=5 μm. With exposure to light (FIG. 3a), the threshold voltage drops from about 20 volts to about 2 volts and the mobility increases from about 0 to about 10 cm$^2$/Vs.

As can be seen from FIGS. 3a and 3b, the drain current follows an alternating voltage of 1 kHz at the gate. The gate voltage changes in steps of 1 volt from 0 volts to +10 volts. Without exposure, the drain current does not increase at this frequency.

Typically, a photo-transistor of the type described herein is energized by applying an alternating voltage at a frequency of about 100 Hz to 1 MHz and having a potential of about 0 to 10 volts applied to the gate electrode while the gate electrode is exposed to a controlled light intensity. The current obtained at the drain zone is then proportionate to the light intensity.

As is apparent from the foregoing specification, the present invention is susceptible of being embodied with various alterations and modifications which may differ particularly from those that have been described in the preceeding specification and description. For this reason, it is to be fully understood that all of the foregoing is intended to be merely illustrative and is not to be construed or interpreted as being restrictive or otherwise limiting of the present invention, excepting as it is set forth and defined in the hereto-appended claims.

We claim as our invention:

1. A method of operating a photo-transistor in MOS thin film technology, comprising steps of:
    (a) providing the MOS photo-transistor as
        (1) a semiconductor body comprising polycrystalline silicon having a source zone and drain zone located therein and spaced from one another by an undoped channel region,
        (2) a gate electrode formed of polycrystalline silicone positioned at and separated from said semiconductor body by an SiO$_2$ layer generated on the silicon semiconductor body by thermal oxidation, and
        (3) a high defect density boundary region between the semiconductor body and the SiO$_2$ layer;
    (b) applying an alternating voltage to the gate and applying an operating voltage between the source and drain zones;
    (c) exposing the photo-transistor to varying light amplitudes to cause variations in drain current; and
    (d) the photo-transistor being operable with the gate voltage lying anywhere in a range from 100 Hz to 1 Mhz.

2. A method according to claim 1 wherein the photo-transistor is operable with a gate voltage in a range from greater than 0 to 10 volts.

3. A method of operating a photo-transistor in MOS thin film technology, comprising steps of:
    (a) providing the MOS photo-transistor as
        (1) a semiconductor body comprising polycrystalline silicon having a source zone and drain zone located therein and spaced from one another by an undoped channel region,
        (2) a gate electrode formed of polycrystalline silicon positioned at and separated from said semiconductor body by an SiO$_2$ layer generated on the silicon semiconductor body by thermal oxidation, and
        (3) a high defect density boundary region between the semiconductor body and the SiO$_2$ layer;
    (b) applying an alternating voltage to the gate and applying an operating voltage between the source and drain zones;
    (c) with no light exposure on the photo-transistor, substantially no drain current flows; and
    (d) with increasing light exposure on the photo-transistor, more and more defects in the boundary region are filled and a surface potential associated with the boundary region follows the alternating gate voltage faster and faster.

4. A method according to claim 3 including the step of providing the source and drain zones with a concentration of more than $10^{18}$ arsenic ions per cubic centimeter.

5. A method according to claim 4 including the step of providing the SiO$_2$ layer with a thickness of between 30 to 50 nm and the semiconductor body with a thickness of 500 to 1000 nm.

6. A method of operating a photo-transistor in MOS thin film technology, comprising steps of:
    (a) providing the MOS photo-transistor as (1) a semiconductor body comprising polycrystalline silicon having a source zone and drain zone located therein and spaced from one another by an undoped channel region,
(2) a gate electrode formed of polycrystalline silicon positioned at and separated from said semiconductor body by an SiO$_2$ layer generated on the silicon semiconductor body by thermal oxidation, and
(3) a high defect density boundary region between the semiconductor body and the SiO$_2$ layer;
(b) applying an alternating voltage to the gate and applying an operating voltage between the source and drain zones; and
(c) with light exposure on the photo-transistor, operating the photo-transistor at frequencies greater than 10 kHz.

7. A method according to claim 6 including the step of providing the operating voltage in a range between 5 and 10 volts.

8. A method of operating a photo-transistor in MOS thin film technology, comprising steps of:
(a) providing the MOS photo-transistor as
(1) a semiconductor body comprising polycrystalline silicon having a source zone and drain zone located therein and spaced from one another by an undoped channel region,
(2) a gate electrode formed of polycrystalline silicon positioned at and separated from said semiconductor body by an SiO$_2$ layer generated on the silicon semiconductor body by thermal oxidation, and
(3) a high defect density boundary region between the semiconductor body and the SiO$_2$ layer;
(b) applying an alternating voltage to the gate and applying an operating voltage between the source and drain zones; and
(c) the alternating voltage applied to the gate being at least 10 kHz and having a potential between 0 to 10 volts.

* * * * *